United States Patent
Fluhrer et al.

(10) Patent No.: US 7,633,158 B2
(45) Date of Patent: Dec. 15, 2009

(54) ELECTRONIC COMPONENT COMPRISING A COOLING SURFACE

(75) Inventors: Christoph Fluhrer, Neuried (DE); Herbert Schnieder, Munich (DE)

(73) Assignee: Rohde & Schwarz GmbH & Co., KG, Munich (DE)

( * ) Notice: Subject to any disclaimer, the term of this patent is extended or adjusted under 35 U.S.C. 154(b) by 0 days.

(21) Appl. No.: 10/570,798

(22) PCT Filed: Sep. 1, 2004

(86) PCT No.: PCT/EP2004/009740

§ 371 (c)(1), (2), (4) Date: Mar. 6, 2006

(87) PCT Pub. No.: WO2005/024937

PCT Pub. Date: Mar. 17, 2005

(65) Prior Publication Data

US 2006/0284289 A1    Dec. 21, 2006

(30) Foreign Application Priority Data

Sep. 5, 2003    (DE) ............................. 103 41 081
Jan. 27, 2004    (DE) ...................... 10 2004 004 074

(51) Int. Cl.
*H01L 23/66*    (2006.01)

(52) U.S. Cl. ............... 257/728; 257/660; 257/E23.114; 257/E23.118

(58) Field of Classification Search ............ 257/706, 257/730, 711–713, 720, 728, 718, 723, 776, 257/660

See application file for complete search history.

(56) References Cited

U.S. PATENT DOCUMENTS 4,436,951 A    3/1984    Rief et al.
5,898,224 A    4/1999    Akram (Continued)

FOREIGN PATENT DOCUMENTS

DE        689 20 195 T2        12/1994

(Continued)

OTHER PUBLICATIONS

"The RF MOSFET Line, RF Power Field Effect Transistor," Motorola Semiconductor Technical Data, 2002.

*Primary Examiner*—Wael Fahmy
*Assistant Examiner*—Abul Kalam
(74) *Attorney, Agent, or Firm*—Lewis, Rice & Fingersh, L.C.

(57) ABSTRACT

An electronic component comprising at least two connection elements (2,7,8), each provided with at least one contact surface (13.1, 13.2, 13.3, 9, 10) which is used to fix the electronic component (1) to a surface of a printed circuit board. An at least partially plane cooling surface is formed on the first connection element (2), for placing on a cooling body that is oriented in the direction of the side of the electronic component (1) opposing the printed circuit board. The first connection element (2) has at least one raised area (3.1, 3.2, 3.3) on the side thereof facing the printed circuit board, on which the contact surface (13.1, 13.2, 13.1) of the first connection element (2) is formed. Said first connection element (2) also has at least one recessed area (4, 4') in which the at least one other connection element (7, 7'; 8, 8') is arranged.

13 Claims, 7 Drawing Sheets

U.S. PATENT DOCUMENTS

| | | |
|---|---|---|
| 2002/0096756 A1 | 7/2002 | Kobayakawa |
| 2002/0121684 A1 | 9/2002 | Kobayakawa |
| 2002/0140082 A1* | 10/2002 | Matayabas .................. 257/706 |
| 2002/0190374 A1* | 12/2002 | Nakajima et al. ........... 257/707 |
| 2003/0122245 A1* | 7/2003 | Chu et al. ................... 257/706 |
| 2003/0137040 A1* | 7/2003 | Standing ..................... 257/685 |
| 2004/0061221 A1* | 4/2004 | Schaffer ..................... 257/723 |
| 2005/0087854 A1* | 4/2005 | Choi et al. .................. 257/686 |
| 2007/0111374 A1* | 5/2007 | Islam et al. ................. 438/106 |

FOREIGN PATENT DOCUMENTS

| | | |
|---|---|---|
| DE | 195 22 455 A 1 | 1/1997 |

\* cited by examiner

ELECTRONIC COMPONENT COMPRISING A COOLING SURFACE

CROSS REFERENCE TO RELATED APPLICATIONS

This application claims priority to German Patent Application Serial No.: DE102004004074.5 filed Jan. 27, 2004 and German Patent Application Serial No.: DE10341081.3 filed Sep. 5, 2003.

BACKGROUND

1. Field of the Invention

The invention relates to an electronic component for assembly on the surface of a printed-circuit board, especially a power transistor for high-frequency applications.

2. Description of the Related Art

Electronic components, especially power transistors, which are mounted on the surface of a printed-circuit board, are already known. If these components must be cooled during operation, a mounting, by means of which a cooling element can be attached to the component, must be provided on the component in addition to the contact surfaces of the component. A high-frequency power transistor with a synthetic-material housing is known, for example, from the technical datasheet "MRF 1535T1/D", Motorola Inc. Connecting elements of the transistor are guided laterally outwards from the synthetic-material housing and folded in the direction of the side of the component facing towards the printed-circuit board. A contact surface is formed on each of the folded ends of the connecting elements, so that the component can be fitted onto the surface of a printed-circuit board. A flat surface, which can be brought into contact with a cooling element, is provided on the opposite side of the component, and a part of the housing of the component is formed on the side of the component facing away from the printed-circuit board. In order to attach the cooling element to this contact surface, recesses are provided in the transistor housing, which is made from synthetic material, by means of which the transistor and the cooling element can be bolted jointly to the printed-circuit board.

A folding of the connecting elements is disadvantageous, especially for applications in the high-frequency range. The curved geometry of the connecting elements generates a high parasitic inductivity and possibly also parasitic capacity, which reduce the useful frequency range. Furthermore, as a result of the relatively small contact surface between the cooling element and the transistor, a special cooling element is required in order reliably to remove the quantity of heat occurring during the operation of a power transistor of this kind. Moreover, this special cooling element must be attached directly to the component housing to ensure good thermal transfer.

SUMMARY

The object of the invention is to provide an electronic component, which allows simple assembly on the surface of a printed-circuit board and a simplified arrangement of a cooling element, wherein the occurrence of a parasitic inductivity and/or capacity is avoided.

The object is achieved by the component of the invention according to claim 1.

With the component according to the invention, the contact surfaces are arranged on connecting elements in such a manner that the electronic component can be attached by the contact surfaces to the surface of a printed-circuit board. In this context, a connecting element is designed in such a manner that an at least partially flat cooling surface, which can be brought into contact with a cooling element, is formed on the side facing away from the printed-circuit board. On the side facing towards the printed-circuit board, this connecting element is formed in such a manner that it provides at least one raised region and at least one recessed region. The contact surface of this first connecting element is formed on such a raised region of the connecting element. The further connecting element and/or the further connecting elements is/are arranged in the recessed region or recessed regions of the first connecting element, on which the respective contact surface is formed.

The further connecting elements can be guided in a straight line towards the surface of the printed-circuit board, because the further connecting elements are formed in the at least one recessed region of the first connecting element and because the contact surface of the first connecting element is formed in a raised region of the first connecting element. This not only shortens the entire signal path from the contact position on the printed-circuit board to the semiconductor substrate, which is connected with bonding wires to the individual connecting elements, but also achieves an improved geometry of the connecting elements and accordingly a reduction in parasitic inductivities and capacities by comparison with known components, which are provided for assembly on the surface of the printed-circuit board.

The dependent claims specify advantageous further developments of the electronic component according to the invention.

The connecting elements are arranged within the projection of the flat cooling surface. Accordingly, a cooling element, which is in contact with the flat cooling surface, can be attached to the printed-circuit board, for example, by means of a spring clip, which presses the cooling element onto the electronic component, without needing to take into consideration in the corresponding region of the printed-circuit board any soldering surfaces, which may be present for the contact surfaces of the connecting elements. As a result of the arrangement of the connecting elements, the soldering surfaces are necessarily also disposed within the projection of the flat cooling surface on the printed-circuit board. Moreover, a shielding of the high-frequency radiation occurring and/or present in the component is achieved as a result of the covering all parts of the component with the flat cooling surface, which is manufactured from a metallic material.

A further improvement of the shielding of the component is achieved in that the raised region surrounds the recessed region in the form of an enclosed ring. The flat cooling surface and the raised region therefore form a trough-like geometry, into which the remaining parts of the component are inserted. Placing the entire component on the printed-circuit board achieves an encapsulation of the component by the first connecting element, which is manufactured in metal, and accordingly a shielding by the electronic component itself, without the necessity for an additional cover.

Moreover, it is advantageous to form in the first connecting element several recessed regions, which can be provided, for example, by milling a cuboidal blank, wherein a semiconductor substrate is arranged in each of the recessed regions, and additionally, the further connecting elements necessary for each semiconductor substrate are formed in the corresponding recessed region. A symmetrical structure of this kind, known, for example, as a "push-pull" or "matched" structure, improves the performance of the electronic components in the high-frequency range and accordingly reduces the expenditure required for an adaptation network.

By contrast with the further connecting elements, the first connecting element is used in common for the entire semiconductor substrate of the electronic component, wherein, according to a particularly preferred embodiment, the first connecting element is a source connection of a field-effect transistor. As a result of the joint use of the first connecting element as a source connection for a field-effect transistor with several semiconductor substrates, the occurrence of potential differences between the respective source connections of the individual semiconductor substrates is advantageously avoided.

Furthermore, it is advantageous to design the entire surface of the electronic component facing away from the printed-circuit board as a flat cooling surface. In addition to the large contact surface between the cooling element and the electronic component, which favours heat transfer, in the context of the heat transfer between the flat surface and an adjoining housing structure, this also prevents the occurrence of a difference in the level of the flat cooling surface and the adjoining housing structure, which would prevent the cooling element from lying flush on the flat surface.

The electronic component according to the invention is illustrated in the drawings and explained in greater detail in the description below. The drawings are as follows:

DETAILED DESCRIPTION OF THE PREFERRED EMBODIMENT(S)

Figure 1:
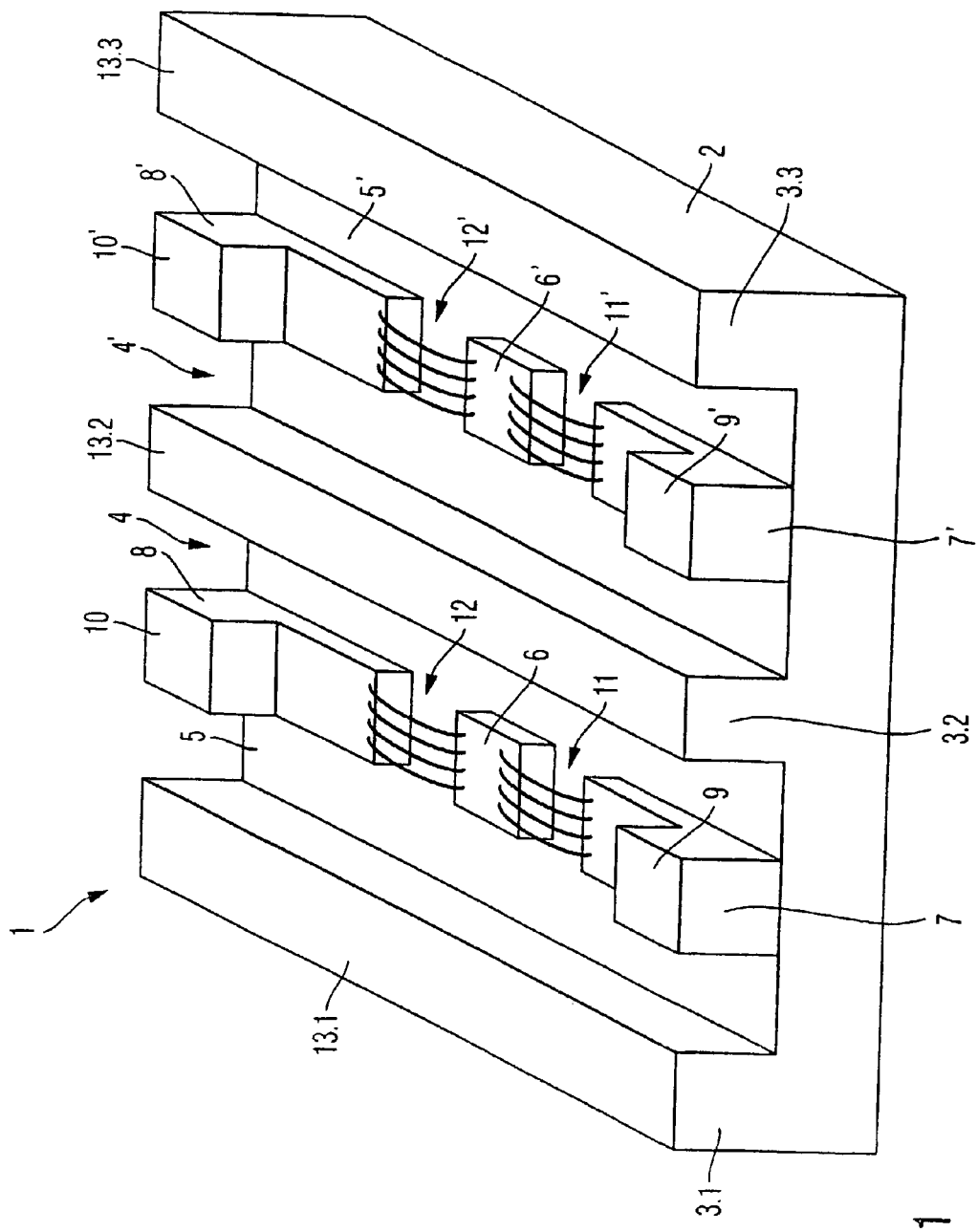
FIG. 1 shows a first exemplary embodiment of an electronic component according to the invention.

FIG. 1 shows a first exemplary embodiment of an electronic component 1 according to the invention. A substantial part of the housing of the electronic component 1 is formed by a first connecting element 2. In the first exemplary embodiment, the first connecting element 2 is formed with a rectangular base surface. Parallel to an outer edge of the rectangular base surface, a first raised region 3.1, a second raised region 3.2 and a third raised region 3.3 are formed on the side of the electronic component 1, which will be arranged on the printed-circuit board after assembly. The three raised regions 3.1, 3.2 and 3.3 are distributed uniformly over the base surface of the first connecting element 2.

A recessed region 4 and respectively 4' is formed between the adjacent raised regions, that is to say, between the first raised region 3.1 and the second raised region 3.2, and between the second raised region 3.2 and the third raised region 3.3 respectively. These recessed regions 4 and 4' are formed in a particularly advantageous manner in the first connecting element 2 in that the two recessed regions 4 and 4' are formed by the introduction of parallel longitudinal grooves, for example, by means of a milling machine.

For the sake of simplicity, the explanation of the arrangement of further elements will be limited to the first of the two recessed regions. The arrangement in the second of the recessed regions 4' corresponds to that of the recessed region 4. Corresponding elements of the two regions are shown in the second recessed region 4' by reference numbers with an apostrophe.

The recessed region 4 extends from the first raised region 3.1 to the second raised region 3.2 and provides a base surface 5. A semiconductor substrate 6 is placed onto this base surface 5 and connected to the first connecting element 2 in a conductive manner. The semiconductor substrate 6 can be, for example, a transistor element or a group of transistors of a field-effect transistor, of which the region acting as the source is glued in a conductive manner to the base surface 5. Another per se known connecting technique can be used instead of gluing.

A second connecting element 7 and a third connecting element 8 are also arranged on the base surface 5 of the recessed region 4. However, by contrast with the semiconductor substrate 6, these further connecting elements 7 and 8 are attached to the base surface 5 of the recessed region 4 of the first conducting element 2 in an insulating manner and not in a conductive manner. In order to contact the gate, for example, the second connecting element 7 is connected to the semiconductor substrate 6 by means of bonding wires 11. Correspondingly, the third connecting element 8 is also connected to the drain by means of bonding wires 12.

In each of the three raised regions 3.1, 3.2 and 3.3, the electronic component 1 provides a contact surface 13.1, 13.2 and 13.3, which is connected by a corresponding soldering surface to the surface of the printed-circuit board. Moreover, a second contact surface 9 is formed in order to make an electrical contact with the electronic component 1 at the second connecting element 1. A corresponding third contact surface 10 is formed on the third connecting element 8, which, like the second contact surface 9, is orientated in the same direction as the contact surfaces 13.1, 13.2 and 13.3. The second contact surface 9 and the third contact surface 10 also designed for soldering to a corresponding soldering surface on the surface of the printed-circuit board.

In the first exemplary embodiment presented, the second connecting element 7 and the third connecting element 8 are arranged on the base surface 5 in the recessed region 4 of the first connecting element 2 in such a manner that the side of the connecting elements 7 and 8 orientated towards the outside of the first connecting element 2 terminates flush with the respective lateral surface of the first connecting element 2. In a similar manner, it is conceivable, that the second connecting element 7 and the third connecting element 8 are arranged on the base surface 5 with a slight backward offset relative to the outer limit of the first connecting element 2.

The relative height difference between the three raised regions 3.1, 3.2 and 3.3 and the recessed regions 4 and 4' disposed between them is selected to be sufficiently large so that the bonding wires 11 and 12 running in a curve pass entirely within the recessed region 4 and can accordingly be protected, for example, by encapsulating the recessed region 4 with a synthetic material. In the exemplary embodiment presented, the necessary height for the second connecting element 7 and the third connecting element 8 required to bring the second contact surface 9 and the third contact surface 10 to the same level as the contact surfaces 13.1, 13.2 and 13.3 is achieved in that the two connecting elements 7 and 8 have an L-shaped geometry, of which the flat regions arranged on the base surface 5 are connected to the gate or the drain via the bonding wires 11 and 12.

Figure 2:
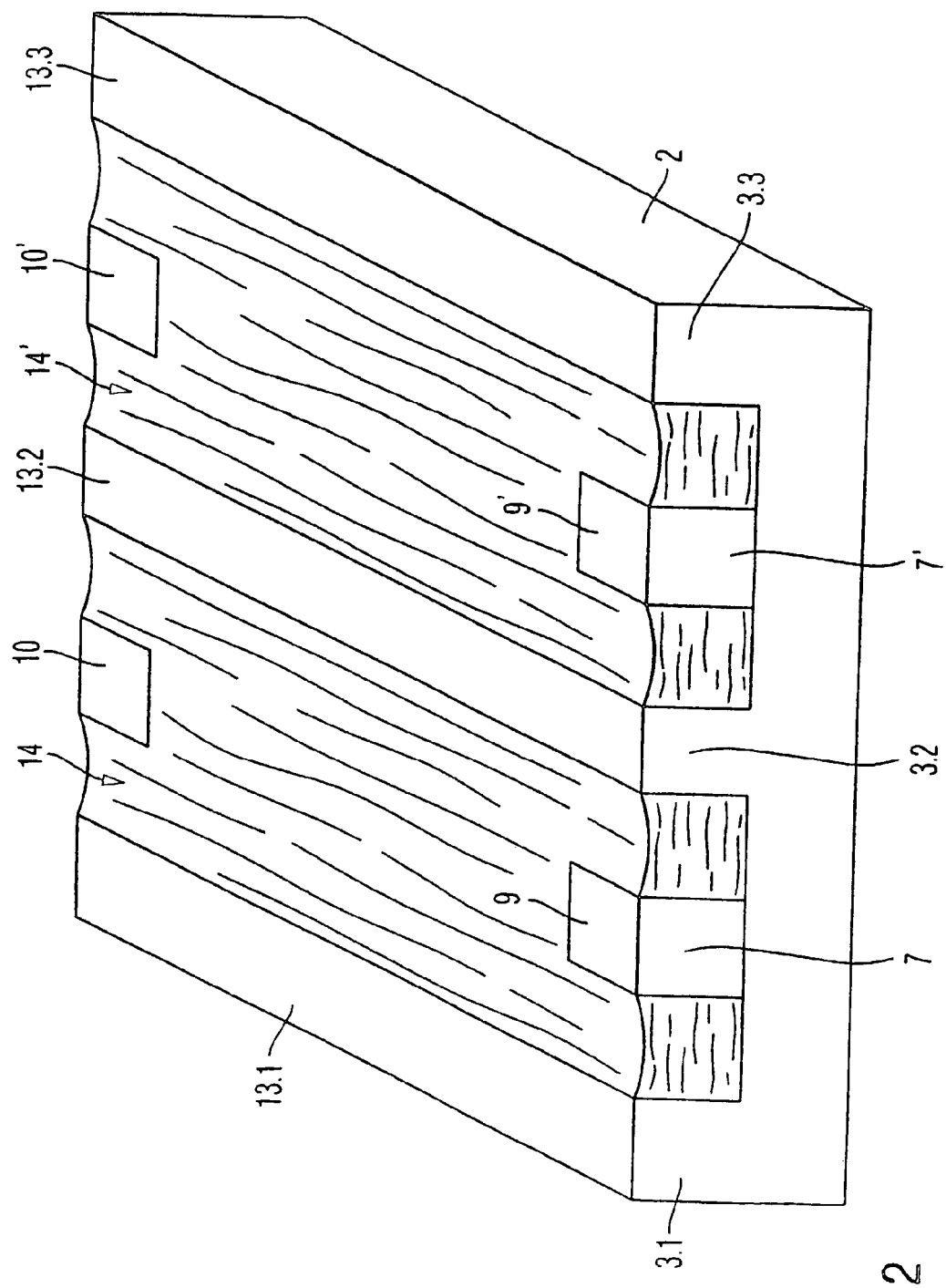
FIG. 2 shows a schematic presentation of the arrangement of the contact surfaces of the first exemplary embodiment of an electronic component.

The exemplary embodiment from FIG. 1 is illustrated again in FIG. 2 in another perspective view, wherein the recessed regions 4 and 4' have already been encapsulated, for example, with a synthetic material 14 and 14', in order to protect the elements arranged therein. Only the contact surfaces 13.1, 13.2 and 13.3 and the second contact surfaces 9 and 9' and the third contact surfaces 10 and 10' project from the surface of the synthetic material 14 and 14' facing towards the printed-circuit board.

Furthermore, the exemplary embodiment presented shows that the limiting surfaces of the connecting elements 7 and 7' facing to the side are also not covered by the synthetic material encapsulation. As already explained in the description of FIG. 1, the connecting elements 7 and 8 can also be offset in the direction towards the middle of the first connecting element 2, so that only the respective contact surfaces 9 and 10 of the second and third connecting elements 7 and 8 project through the surface of the synthetic material encapsulation.

Instead of using the three contact surfaces 13.1, 13.2 and 13.3 of the first connecting element 2 for the electrical contact, it is also possible to use only the middle contact surface 13.2, for example. The two other contact surfaces 13.1 and 13.3 of the first connecting element 2 can then be attached to a nonconductive region of the surface of the printed-circuit board thereby serving to absorb mechanical stresses caused, for example, by the attachment of a cooling element to the flat cooling surface, which is concealed in the diagram.

Figure 3:
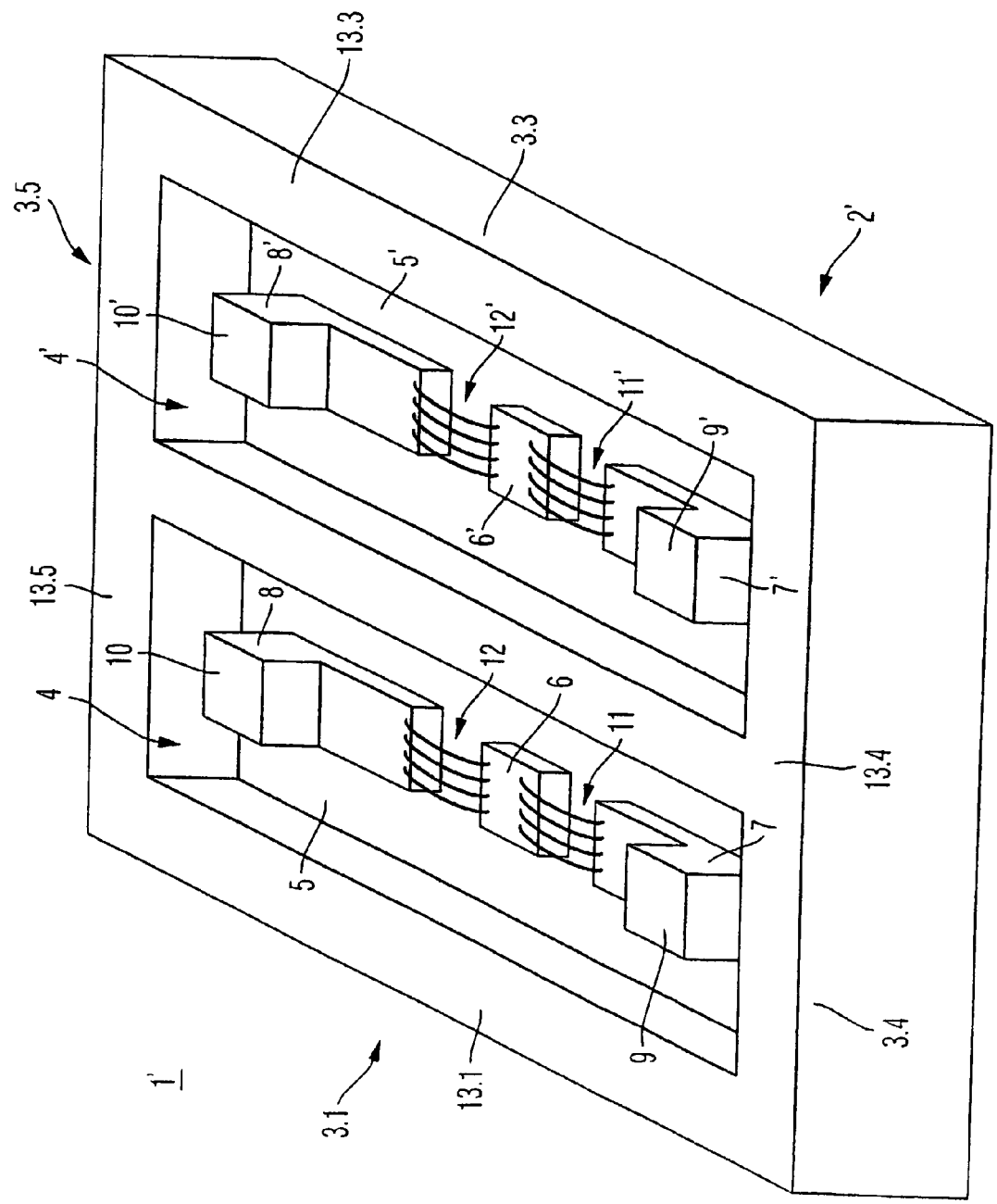
FIG. 3 shows a second exemplary embodiment of an electronic component according to the invention.

FIG. 3 shows a further exemplary embodiment of an electronic component 1', wherein those elements which correspond with the elements of the first exemplary embodiment from FIG. 1 are indicated with identical reference numbers, and further description is omitted in order to avoid unnecessary repetition.

By contrast with the first exemplary embodiment, the recessed regions 4 and 4' illustrated in FIG. 3 are completely surrounded by the raised regions. Alongside the raised regions 3.1, 3.2 and 3.3 already known from FIG. 1, further raised regions 3.4 and 3.5 are therefore provided to connect the raised regions 3.1, 3.2 and 3.3 to one another at opposite external sides of the connecting element 2'. As a result of the raised regions 3.1, 3.2, 3.4 and 3.5, the recessed region 4 is therefore completely enclosed within a ring shape. The second recessed region 4' is therefore also surrounded in an enclosed manner by the raised regions 3.2, 3.3, 3.4 and 3.5. Accordingly, the only side of the electronic component 1', which is not encased by conductive material is the side facing towards the surface of the printed-circuit board.

As a result, the electronic component 1' assembled on the printed-circuit board does not require any additional shielding from high-frequency radiation, because all of the elements, especially the semiconductor substrate 6 and 6', are surrounded by the first connecting element 2'.

Figure 4:
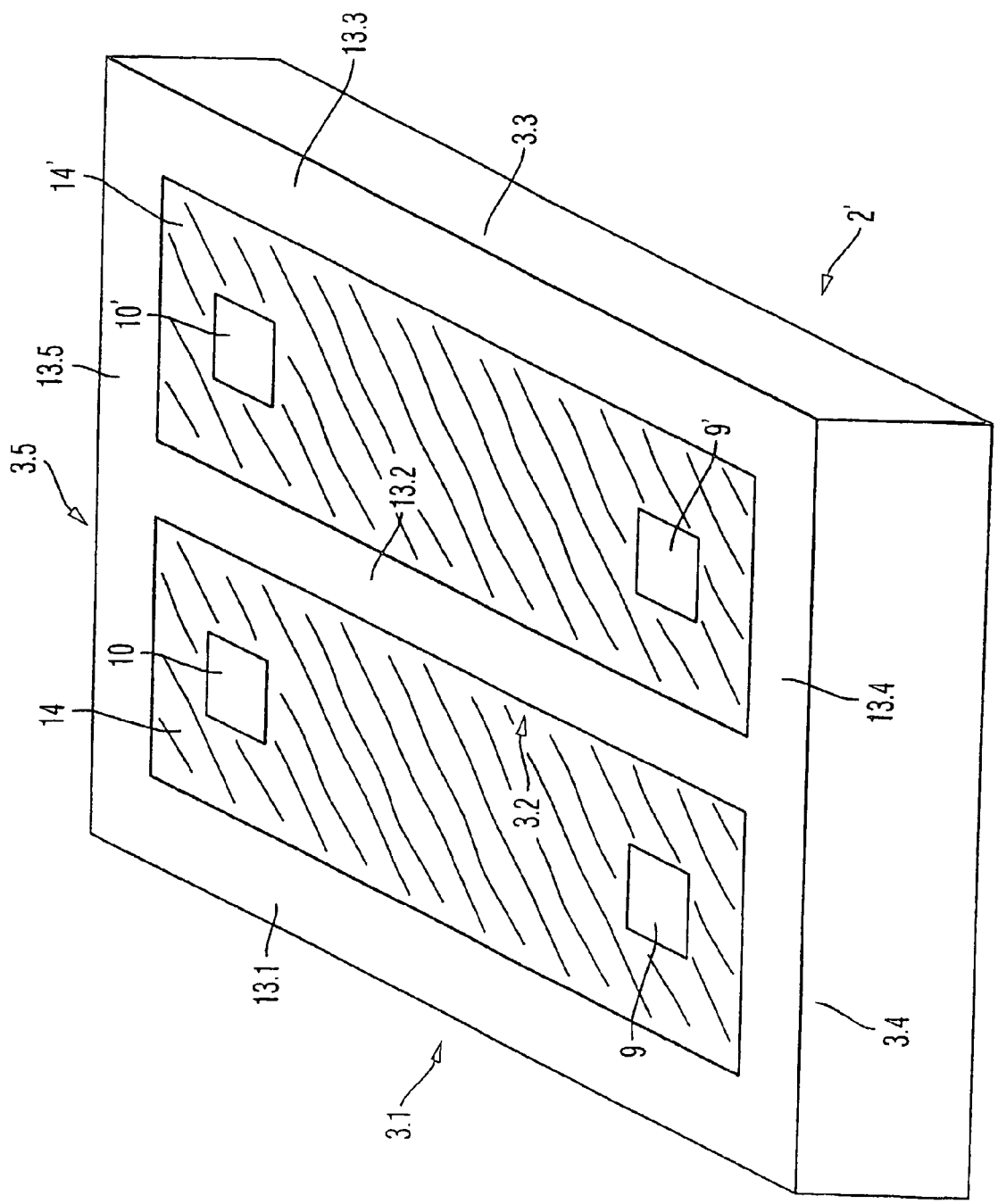
FIG. 4 shows a schematic presentation of the arrangement of the contact surfaces of the second exemplary embodiment of an electronic component.

FIG. 4 shows the electronic component 1' illustrated in FIG. 3 in a perspective view, wherein the two recessed regions 4 and 4' are again encapsulated. Only the contact surfaces of the raised regions 3.1, 3.2, 3.3, 3.4 and 3.5 and the second contact surfaces 9 and 9' and the third contact surfaces 10 and 10' project from the material used for encapsulating the recessed regions 4 and 4', so that they can be connected to corresponding soldering surfaces on the printed-circuit board.

Figure 5:
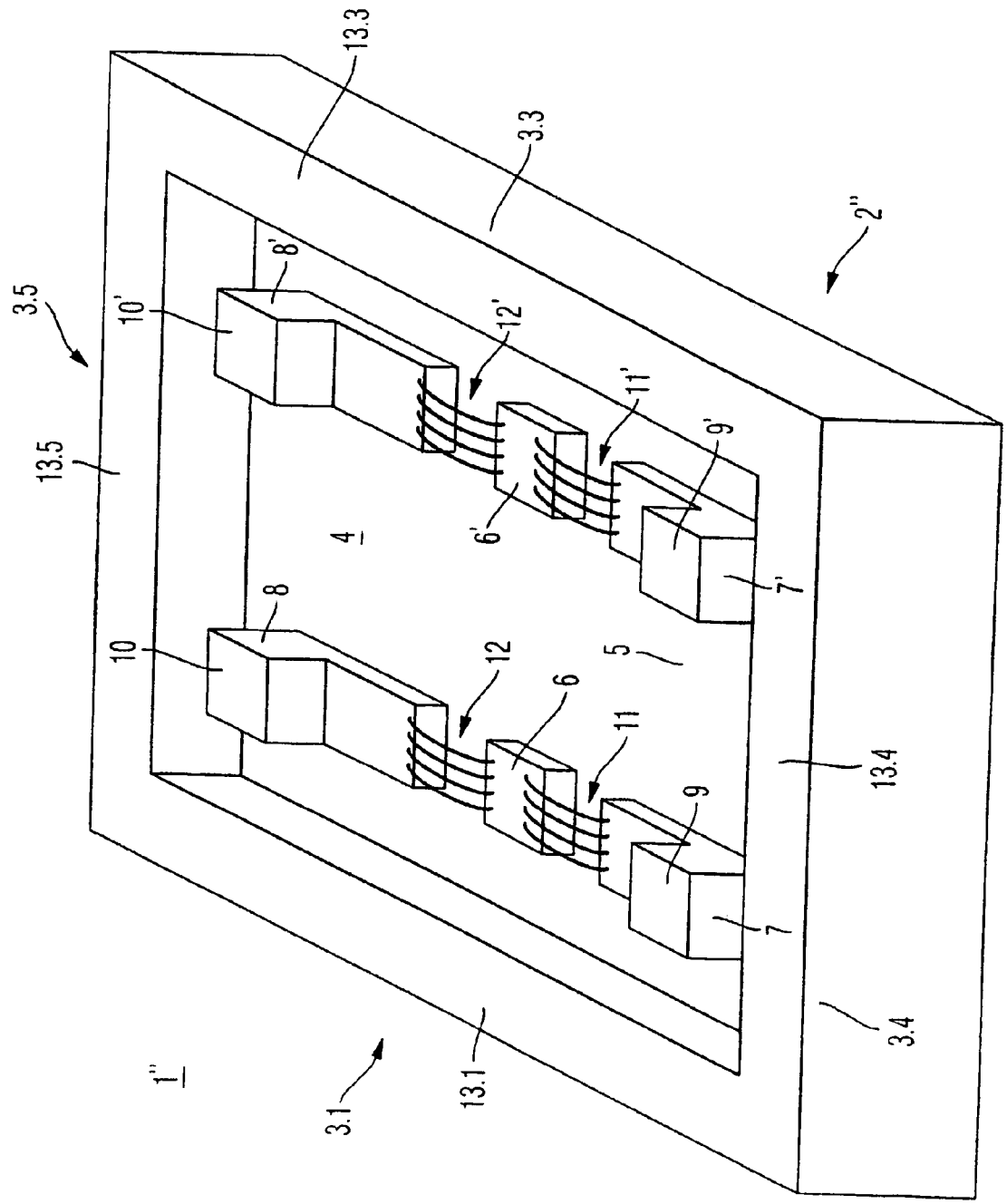
FIG. 5 shows a third exemplary embodiment of an electronic component according to the invention.

With the third exemplary embodiment, as shown in FIG. 5, the raised region 13.2 is not present. Otherwise, the structure corresponds to the second exemplary embodiment. Removing the raised region 13.2 forms a single, large recessed region 4, in which both the semiconductor substrate 6 and also the further semiconductor substrate 6' and the respective second connecting element 7 and 7' and the respective third connecting element 8 and 8' are arranged together. The large recessed region 4 and the elements arranged therein are jointly surrounded by the ring shape formed by the raised regions 3.1, 3.3, 3.4 and 3.5 and are therefore once again well protected from high-frequency radiation.

Moreover, in all three exemplary embodiments, after assembly on the printed-circuit board, the electronic component is well supported on the surface of the printed-circuit board by the raised regions, so that a cooling element, which is mounted not on the electronic component itself, but on a fastening device (not illustrated) on the printed-circuit board, can be pressed, for example, by means of a spring device, onto the contact surface of the first connecting element. The absorption of forces by the first connecting element 2' also avoids the need for an absorption of forces by the synthetic material encapsulation, for example, during the assembly of the cooling element, which under extreme conditions, can lead to a destructive stress on the components arranged therein.

Figure 6:
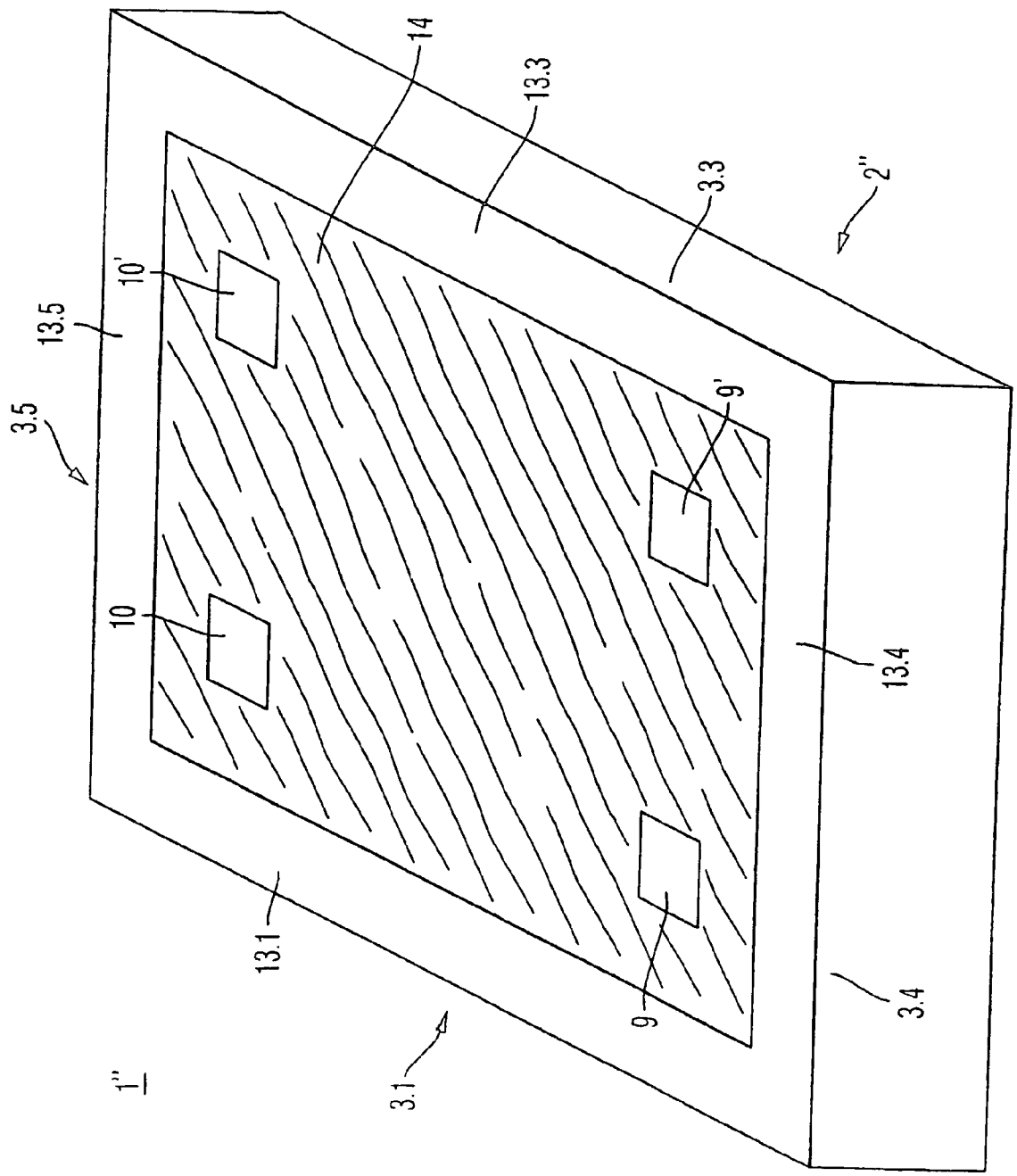
FIG. 6 shows a schematic presentation of the arrangement of the contact surfaces of the third exemplary embodiment of an electronic component according to the invention and FIG. 7 shows an exemplary presentation of soldering surfaces arranged on a printed-circuit board for the reception of a first exemplary embodiment of the component according to the invention and an exemplary presentation of a cooling element.

FIG. 6 illustrates the contact surfaces 9, 9', 10, 10' and 13.1, 13.3, 13.4 and 13.5 of the electronic component 1" of the third exemplary embodiment, once again arranged within the single recessed region 4.

Figure 7:
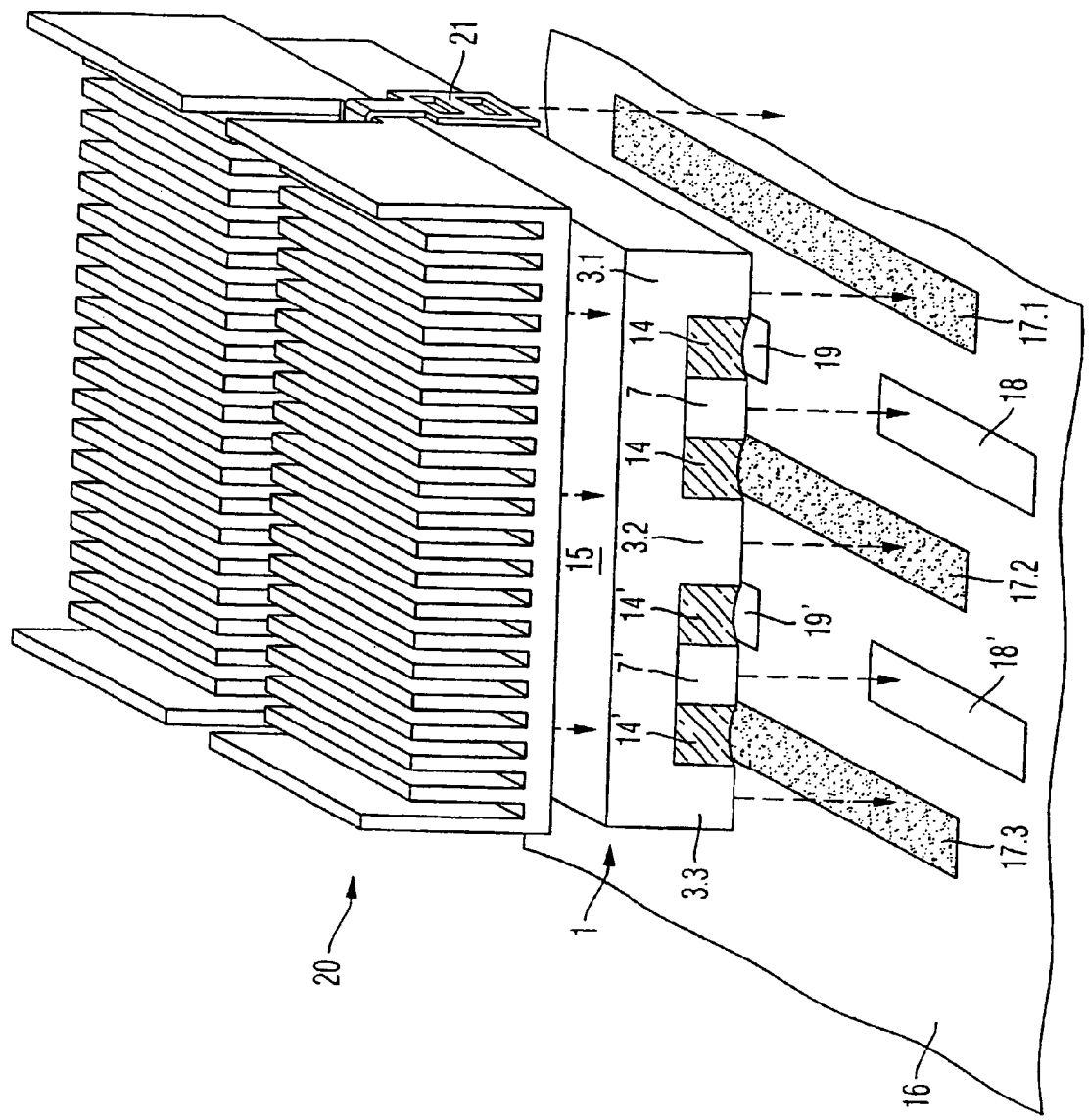

FIG. 7 shows the arrangement of the electronic component 1 in the context of the assembly on a printed-circuit board 16, as explained in detail with regard to FIGS. 1 and 2. The view of the electronic component 1 from the rear, that is to say, from the side facing away from the printed-circuit board 16, shows a flat cooling surface 15, which is formed on the first connecting element 2. In the exemplary embodiment illustrated, the flat cooling surface 15 is identical to the external dimensions of the electronic component 1 as a whole. Accordingly, all of the further connecting elements 7 and respectively 7' and 8 and respectively 8' are disposed on the surface of the printed-circuit board 16 within the projection of the external periphery of the flat cooling surface 15. The formation of the flat cooling surface 15 on the electronic component 1 as illustrated corresponds to the formation of the flat cooling surfaces on the electronic components 1' and 1" of the second and third exemplary embodiment.

A similarly flat surface of an arbitrary cooling element 20, for example, as illustrated, which is suitable for mounting on the printed-circuit board, can be attached to the flat cooling surface 15. For example, a standard cooling element 20 provided for computer processors can be placed onto the electronic component and held in contact with the cooling surface 15 by means of a spring clip 21.

Soldering surfaces are provided on the printed-circuit board 16 for the attachment of the electronic component 1 and the connection of the connecting elements of the electronic component 1. For example, FIG. 7 shows the first soldering surfaces 17.1, 17.2 and 17.3, onto which the contact surfaces 13.1, 13.2 and 13.3 of the corresponding raised regions 3.1, 3.2 and 3.3 of the first connecting element 2 can be placed. Corresponding, second soldering surfaces 18 and 18' are provided for the second connecting elements 7 and 7'. Finally, third soldering surfaces 19 and 19' are provided on the surface of the printed-circuit board 16 for the third connecting elements 8 and 8', which are concealed in FIG. 7.

As already explained with reference to the exemplary embodiments of the electronic component 1, corresponding soldering surfaces 17.1, 17.2 and 17.3 for soldering to the respective contact surfaces 13.1, 13.2 and 13.3 need not be provided for all of the raised regions 3.1, 3.2 and 3.3. To achieve a symmetrical connection of the respective semiconductor substrate 6 and 6', it is adequate, for example, if only the soldering surface 17.2 with the corresponding contact surface 13.2 of the raised region 3.2 of the first connecting element 2 is present.

The formation of the flat cooling surface 15 over the entire surface occupied by the electronic components 1, allows not only the use of standard cooling elements, but also ensures a particularly large contact surface between the cooling element 20 and the electronic component 1. The design and manufacture of high-power cooling elements, which provide a geometry matched specially to the structural shape of the housing of a high-frequency transistor, is therefore not necessary. By comparison with conventional transistors for high-frequency applications, the component 1 or respectively 1' or respectively 1" according to the invention also has the advantage that only a slight influence of the geometry of the further connecting elements 7, 7' and respectively 8, 8' occurs, because parasitic inductivities and capacities only occur to a limited extent.

In particular, microprocessor cooling elements normally used in computer systems are used as standard cooling elements of this kind. In the latter context, they are used for cooling the central processing unit, for example, an Intel Pentium or an AMD Athlon. Typically, microprocessor cooling elements of this kind have a square base surface of approximately 80 millimetres edge length. A cooling element of this kind therefore exceeds to a considerable extent the dimensions of the power transistor to be cooled with a typical rectangular geometry with edge lengths of 15 millimetres and 30 millimetres. However, as a result of the arrangement on the electronic component 1 according to the invention, an adequate cooling performance is ensured especially because of this size together with the temperature difference between the component and the environment, which is greater by comparison with the computer system.

In order to avoid parasitic inductivities and capacities, a considerable contribution is made especially by the fact that the connecting elements are not guided laterally out of a housing and then folded in curve around a non-conductive synthetic-material housing in such a manner that the actual contact surface is once again arranged on the printed-circuit board within a projection of the housing of the component, as is the case with the transistor MRF 1535 T1 manufactured by Motorola Inc. By contrast, the connecting elements of the component 1 according to the invention are guided largely in a straight line towards the printed-circuit board. A slight deviation from the straight line geometry is required only for the fixing of the bonding wires, so that the connecting elements have an L-shaped geometry, of which the inductive character is, however, negligible.

The invention claimed is:

1. An electronic component comprising
a first connecting element including:
    a first side including an at least partially flat cooling surface, said partially flat cooling surface comprising a means for contacting a cooling element; and
    a second side including:
        at least one recessed region;
        a first raised region extending from said second side and including at least one contact surface with which said electronic component can be attached to a surface of a printed-circuit board; and
        a second raised region extending about equal distance from said second side as said first raised region and including at least one contact surface with which said electronic component can be attached to a surface of a printed-circuit board; and
at least one additional connecting element, each of said at least one additional connecting element including at least one contact surface with which the electronic component can be attached to said surface of said printed-circuit board;
wherein, each of said at least one additional connecting element is arranged in said at least one recessed region on a base surface of said at least one recessed region;
wherein there is a semiconductor substrate on said base surface; and
wherein, said first connecting element is formed as a single monolithic piece; and
wherein said first connecting element is manufactured from metal; and
wherein, each of said at least one additional connecting element is connected to said semiconductor substrate by bonding wires; and
wherein at least one recessed region is encapsulated with synthetic material; and
wherein said first raised region surrounds said at least one recessed region to form an enclosed ring; and
wherein said at least one contact surface with which said electronic component can be attached to a surface of a printed circuit board on said first raised region is in the plane of said first raised region.

2. The electronic component of claim 1, wherein each of said at least one additional connecting element is arranged in such a manner that said additional connecting element does not project beyond an outer edge of said cooling surface.

3. The electronic component of claim 1 wherein at least one of said first or said second raised regions extends at least partially along an outer edge-of said electronic component.

4. The electronic component of claim 1 wherein said contact surfaces are formed as surfaces plane-parallel to said flat cooling surface.

5. The electronic component of claim 1 wherein said at least one recessed region are formed as recesses in an otherwise parallelepiped first connecting element.

6. The electronic component of claim 1 further comprising a plurality of semiconductor substrates arranged in said at least one recessed region.

7. The electronic component of claim 6 wherein said at least one recessed region comprises a plurality of recessed regions and one of said plurality of semiconductor substrates is arranged in each of said recessed regions.

8. The electronic component of claim 7 further comprising a plurality of additional connecting elements wherein at least one of said plurality of additional connecting elements is arranged in each of said recessed regions.

9. The electronic component of claim 8, wherein said first connecting element is a common electrical connecting element for all of said semiconductor substrates 10. The electronic component of claim 1 wherein said first connecting element is a source connection of a field-effect power transistor.

11. The electronic component of claim 10, wherein said at least one additional connecting element form a gate connection and a drain connection of said field-effect power transistor.

12. The electronic component of claim 11 wherein the entire first side is said flat cooling surface.

13. An electronic component comprising
a first connecting element including:
  a first side including an at least partially flat cooling surface, said partially flat cooling surface comprising a means for contacting a cooling element; and
  a second side including:
    at least one recessed region;
    a first raised region extending from said second side and including at least one contact surface with which said electronic component can be attached to a surface of a printed-circuit board; and
    a second raised region extending about equal distance from said second side as said first raised region and including at least one contact surface with which said electronic component can be attached to a surface of a printed-circuit board; and
  at least one additional connecting element, each of said at least one additional connecting element including at least one contact surface with which the electronic component can be attached to said surface of said printed-circuit board;
wherein, each of said at least one additional connecting element is arranged in said at least one recessed region on a base surface of said at least one recessed region;
wherein there is a semiconductor substrate on said base surface; and
wherein, said first connecting element includes no curved geometry; and
wherein said first connecting element is manufactured from metal; and
wherein, each of said at least one additional connecting element is connected to said semiconductor substrate by bonding wires; and
wherein at least one recessed region is encapsulated with synthetic material; and
wherein said first raised region surrounds said at least one recessed region to form an enclosed ring; and
wherein said at least one contact surface with which said electronic component can be attached to a surface of a printed circuit board on said first raised region is in the plane of said first raised region.

* * * * *